United States Patent
Terai et al.

(10) Patent No.: US 8,323,879 B2
(45) Date of Patent: Dec. 4, 2012

(54) METHOD OF FORMING RESIST PATTERN

(75) Inventors: Mamoru Terai, Tokyo (JP); Takuya Hagiwara, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 220 days.

(21) Appl. No.: 12/720,924

(22) Filed: Mar. 10, 2010

(65) Prior Publication Data

US 2010/0233449 A1    Sep. 16, 2010

(30) Foreign Application Priority Data

Mar. 12, 2009    (JP) .................. 2009-059981

(51) Int. Cl.
    G03F 7/26    (2006.01)
(52) U.S. Cl. ...................................... 430/322
(58) Field of Classification Search .............. 430/311, 430/322, 330, 331
    See application file for complete search history.

(56) References Cited

U.S. PATENT DOCUMENTS

| | | | | |
|---|---|---|---|---|
| 2004/0069226 A1* | 4/2004 | Yoshida et al. | ............... | 118/715 |
| 2004/0110106 A1* | 6/2004 | Mokuo | ............... | 432/5 |
| 2006/0014084 A1* | 1/2006 | French et al. | ............... | 430/5 |
| 2010/0124720 A1* | 5/2010 | Ishiduka et al. | ............... | 430/271.1 |

FOREIGN PATENT DOCUMENTS

| | | |
|---|---|---|
| JP | 04-217258 | 8/1992 |
| JP | 2000-089475 | 3/2000 |
| JP | 2007-180253 | 7/2007 |
| TW | 200616101 A | 5/2006 |

OTHER PUBLICATIONS

Chinese Office Action, and English translation thereof, issued in Chinese Patent Application No. 201010136569.2 dated Jun. 28, 2012.

* cited by examiner

Primary Examiner — Kathleen Duda
(74) Attorney, Agent, or Firm — McDermott Will & Emery LLP

(57) ABSTRACT

The present invention relates to a method of forming a resist pattern for obtaining an electronic device in which a development defect is eliminated, and aims at providing a process that is simple and low-cost, and can impart a high hydrophobicity capable of high-speed scan. It relates to a method of forming a resist pattern including the steps of: providing immersion exposure to a resist film; solubilizing the resist film subjected to the immersion exposure in an alkaline developer; developing the resist film solubilized in the alkaline developer by alkali immersion; and performing a deionized water rinse treatment on the developed resist film in this order, wherein the step of solubilization in the alkaline developer is performed by exposing the resist film subjected to the immersion exposure to ozone gas without irradiating ultraviolet rays (hereinafter, sometimes referred to as ozone treatment).

5 Claims, 11 Drawing Sheets

METHOD OF FORMING RESIST PATTERN

CROSS-REFERENCE TO RELATED APPLICATION

The disclosure of Japanese Patent Application No. 2009-59981 filed on Mar. 12, 2009 including the specification, drawings and abstract is incorporated herein by reference in its entirety.

BACKGROUND OF THE INVENTION

The present invention relates to a method of forming a resist pattern.

In immersion exposure, using a system of causing the space between a lens and a face to be irradiated (wafer) to have a high refraction index by forming a water film (meniscus) at a minute gap between the lens and the wafer while utilizing the surface tension of water, an effective lens numerical aperture (NA) can be enhanced up to the vicinity of the water refraction index 1.44, as compared with usual dry exposure, and industrially practical application of the exposure is progressing as a technique that enables the resolution limit of lithography to be miniaturized.

In the immersion lithography, since immersion water lies between the lens and the resist being an uppermost layer film of the surface to be irradiated (wafer), there is such anxiety that the use of a chemical amplification resist for usual dry exposure allows a low molecular weight content such as a photoacid generator or a base therein to dissolve in the immersion water to cause, consequently, the pollution of an exposure device such as the lens. Further, when moving the water film (meniscus) over the wafer, if the resist has a low hydrophobicity, a micro droplet remains on the resist after the movement of the meniscus, which induces pattern defect caused by the influence of longtime local contact to moisture. Therefore, a technique, in which a resist upper layer protective film (a topcoat) that dissolves in a developer for not allowing the immersion water to directly contact the resist is used over the resist, is introduced. Furthermore, a topcoat-less resist, in which a small amount of a polymer having a small critical surface tension (mainly, a fluorine-containing polymer) is mixed in the resist liquid as a hydrophobic additive and the hydrophobic additive is concentrated to the surface alone while utilizing the surface segregation effect of the hydrophobic additive at the time of forming a coating film to spontaneously form the two layers of the resist and topcoat as a single coating film, has been developed and offered commercially.

In the immersion lithography, as shown in FIG. 1, the immersion water is formed as a meniscus in a film shape on the photosensitive resist layer, and scanning exposure is practiced by scanning the wafer (in the arrow A direction in FIG. 1) while irradiating light through the meniscus. On this occasion, in order to enable prevention of the dissolution of a low molecular weight compound such as a photoacid generator or a base in the chemical amplification resist into the immersion water, and to allow high-speed and smooth meniscus movement without leaving a droplet, techniques for bringing the surface of the resist layer to be a state in which elution hardly occurs and to have a hydrophobicity are introduced.

One of these techniques is the topcoat process, in which the resist layer is constituted of a two-layer film formed by two coating treatments and a resist upper layer protective film (the topcoat) is coated on a usual resist. The topcoat is frequently constituted of a fluorine-containing polymer having an alkaline developer solubility, in order to be a film that is soluble in an alkaline developer to be automatically peeled off at the time of the development and has a high hydrophobicity. FIG. 2(a) shows the process flow in the topcoat process. However, there are such problems that the topcoat process is lengthy because it is accompanied with two coating treatments, and that the cost of materials is high because two kinds of chemical solutions for the photosensitive resist and the topcoat are used. In addition, since that the topcoat contains a developer soluble group and that it has a high hydrophobicity are in a trade-off relation, frequently it cannot be said that the hydrophobicity is sufficient for higher throughput exposure by more high-speed scan.

On the other hand, as another technique, the topcoat-less resist, in which a small amount of a polymer having a small critical surface tension (a fluorine-containing polymer) is mixed in a photosensitive resist liquid as a hydrophobic additive and the hydrophobic additive is concentrated (segregated) to the surface alone while utilizing the surface segregation effect of the hydrophobic additive at the time of forming a coating film to spontaneously form a segregated layer having the effect of the photosensitive resist and the topcoat as a single coating film by one coating treatment, has been developed and commercialized in the market. The material can suppress the lengthy property of the topcoat process, and, consequently, the increase in the cost of equipment (one coating cup, one bake plate) and the increase in the cost of materials.

FIG. 2(b) shows a process flow using the topcoat-less resist material. As a hydrophobic additive to be added to the topcoat-less resist material in a small amount, when a hydrophobic additive is used which is soluble in a developer as is the case for the topcoat material, the use of a hydrophobic additive having no alkali solubility in an extremely small amount may be considered. Further, there is also such case that a hydrophobic additive, which itself is deprotected by the catalytic reaction of an acid generated by the exposure to change into a state of being soluble in an alkaline developer only in the exposed portion at the time of subsequent post-exposure bake (PEB) as is the case for the chemical amplification resist, is used. As described above, there may be mainly three constitutions as the hydrophobic additive.

When the hydrophobic additive to be added to the topcoat-less resist material is an alkali soluble hydrophobic additive, defects in the resist pattern hardly generate, because the hydrophobic additive is dissolved at the time of the alkali development and, therefore, particles adhering to the resist surface are removed simultaneously. Further, after the removal of the hydrophobic additive, the resist has the hydrophobicity of itself alone and, as a result, is more hydrophilized than before the alkali development. Therefore, there is also a low probability of leaving a particulate residue 10d defect (blob) as shown in FIG. 11(c) caused by a too high hydrophobicity at the time of deionized water rinse after alkali immersion not to allow the resist to be washed cleanly. However, the hydrophobic additive tends to have a low segregation property because an alkali developing property is to be given, and, as is the case for the problem in the topcoat, frequently a sufficient hydrophobicity cannot be obtained.

When a hydrophobic additive having completely no alkali solubility is used as the hydrophobic additive, the hydrophobic additive remains as an insoluble matter at the time of the development, and there are such risks as causing a residue 10b defect as shown in FIG. 11(a), inducing a micro bridge 10c as shown in FIG. 11(b) even in a minor instance, or leaving a particulate residue defect (blob) (FIG. 11(c)) due to a too high hydrophobicity at the time of the deionized water rinse after the immersion into an alkali.

Further, even when a hydrophobic additive is used that itself is deprotected by an acid to change into a hydrophobic additive soluble in an alkaline developer in an exposed portion alone at the time of subsequent post-exposure bake (PEB), the generation of defect is considered to be generated in unexposed portions, as is the problem at the time of using the hydrophobic additive having completely no alkali solubility. That is, in such processes as a hole process that uses a positive resist or a process that uses a dark field mask such as the process of forming a trench for Cu wiring, it can be said that these defect risks are high because the background is left as an unexposed portion.

In conventional immersion lithography processes, the process using the topcoat is widely employed for realizing the immersion exposure while maintaining the performance of the chemical amplified resist. However, there are such problems that the cost of equipment and materials becomes high, and that the hydrophobicity can hardly be obtained for high-speed scan. On the other hand, in processes employing the topcoat-less resist for aiming at the cost reduction and the suppression of the resist pattern defect in the immersion lithography process, there is the same problem as that in the topcoat process (the hydrophobicity for high-speed scan) in the instance of an alkali soluble hydrophobic additive, and a problem of the pattern defect caused by insolubility in a developer in the instance of an alkali insoluble hydrophobic additive or a hydrophobic additive of a type that changes polarity by exposure. These pattern defects cause such problems that a hydrophobic additive re-adheres onto the resist pattern, and that defects caused by the immersion increase when the resist surface layer of unexposed portions maintains high hydrophobicity. These problems appear more remarkably when forming a hole pattern that leaves much resist surface layer.

In Japanese Patent Laid-Open No. 2007-180253 (Patent Document 1), in the process employing the topcoat, defects caused by immersion are suppressed by peeling off a protective film with a peeling liquid capable of selectively dissolving the protective film (the topcoat) over the substrate after the immersion exposure process.

However, according to the method in Patent Document 1, it is necessary to change the content of the peeling liquid on a case-by-case basis in accordance with the material property of the protective film to be used. Further, it is necessary to add a peel-off process with the peeling liquid, which leads to the increase in the product cost and the lowering of the production efficiency. Further, when it is used for the top-coat/resist process, since no distinct interface exists between the hydrophobic additive layer and the resist layer, sufficient peeling and removal of the hydrophobic additive are difficult and defects caused by the immersion cannot be suppressed.

Japanese Patent Laid-Open No. 4-217258 (Patent Document 2) discloses a method of forming a resist pattern, in which the resist surface is modified without changing a developing apparatus to enhance the hydrophilicity of the resist. According to the method of forming a resist pattern of Patent Document 2, after performing the exposure to the resist, ozone generated by heating and irradiating ultraviolet rays is reacted with the resist to impart the hydrophilicity to the resist. For example, a methyl group of the resist made of novolac resin is converted to aldehyde by an ozone treatment to enhance the hydrophilicity of the resist surface.

However, according to the method described in Patent Document 2, after exposing and projecting a reticle pattern to the resist, ultraviolet rays are irradiated, and, therefore, the shape of the formed resist pattern is occasionally softened or deformed by the ultraviolet irradiation after the exposure. Particularly, when the resist pattern includes a minute wiring and a hole having a size of 100 nm or less, the softening and deformation become more remarkable.

Japanese Patent Laid-Open No. 2000-89475 (Patent Document 3) discloses a method of forming a resist pattern, in which the surface of the resist is modified by irradiating light to enhance the hydrophilicity of the resist. According to the method of forming a resist pattern of Patent Document 3, after coating the resist and before exposing and projecting the reticle pattern, light is irradiated to the resist to raise the hydrophilicity of the resist and to enhance the affinity between the resist and the developer, thereby lowering the development defect.

However, according to the method described in Patent Document 3, the resist surface is subjected to a hydrophilizing treatment before the exposure and projection treatment. Accordingly, the hydrophobicity of the resist surface, which is necessary for the scanning exposure in the immersion lithography, is lost prior to the exposure, and it becomes difficult to exert the primary purpose of the topcoat-less resist.

SUMMARY OF THE INVENTION

The present invention was achieved in view of the above problems, and is a method of solubilizing the surface layer of a resist film in an alkaline developer, by subjecting the resist film to an ozone treatment without the irradiation of ultraviolet rays before the development process of the topcoat-less resist.

Specifically, the present invention relates to a method of forming a resist pattern including the steps of: providing immersion exposure to a resist film; solubilizing the resist film subjected to the immersion exposure in an alkaline developer; developing the resist film solubilized in the alkaline developer by alkali immersion; and performing a deionized water rinse treatment on the developed resist film in this order, wherein the step of solubilization in the alkaline developer is performed by exposing the resist film subjected to the immersion exposure to ozone gas without irradiating ultraviolet rays (hereinafter, sometimes referred to as ozone treatment).

The present invention relates to a method of forming a resist pattern, wherein the step of the solubilization in an alkaline developer is performed simultaneously with a post-exposure bake (PEB) treatment, and thereafter performs a step of development by the alkali immersion and a step of deionized water rinse treatment (occasionally, a step including these two steps together is referred to as an ordinary development treatment).

In addition, the present invention relates to a method of forming a resist pattern, wherein the step of the solubilization in an alkaline developer performs the PEB treatment after providing the ozone treatment, and thereafter performs the ordinary development treatment.

Further, it relates to a method of forming a resist pattern, wherein the step of the solubilization in an alkaline developer performs the ozone treatment after performing the PEB treatment, and thereafter performs the ordinary development treatment.

Furthermore, the present invention relates to an electronic device manufactured by any of the above-described methods for forming a resist pattern.

The present invention aims at eliminating the development defect, which is a fault of the topcoat-less resist, in a process capable of achieving high hydrophobicity that is simple and low-cost, and can perform high-speed scan using the topcoat-less resist, by performing the ozone treatment without irradiating ultraviolet rays to the resist surface prior to performing development treatment after exposure. The suppression of direct irradiation of ultraviolet rays and the like, which generate when ozone is generated, to the resist surface can avoid such problems as dissolution, collapse or deformation of the resist pattern.

Further, the ozone treatment can solubilize the resist surface layer in an alkaline developer, which can dissolve and remove materials that cause a defect. Furthermore, it can impart lower hydrophilicity than that the resist resin originally has. This makes it possible to realize an immersion lithography process with high throughput and low defect. The method of forming a resist pattern can be used not only for the topcoat-less resist process, but also for a process using the topcoat and the dry exposure process, to give such effect as lowering the resist pattern defect. The present application provides the method of forming a resist pattern.

The method of forming a resist pattern solubilizes a specified resist surface layer of a hydrophobic additive to be used in an alkaline developer, and can also realize the hydrophilization of the resist surface.

The solubilization in an alkaline developer is achieved by deprotecting a protective group of a resist by the ozone treatment. The hydrophilization of the resist surface can also be achieved by imparting a polar group such as a hydroxyl group or a carboxyl group to a resist composition, in addition to by performing a deprotection reaction by the ozone treatment.

The method of patterning a resist can be employed not only in the topcoat-less resist process but also in processes using the topcoat.

DETAILED DESCRIPTION OF THE PREFERRED EMBODIMENTS

Figure 1:
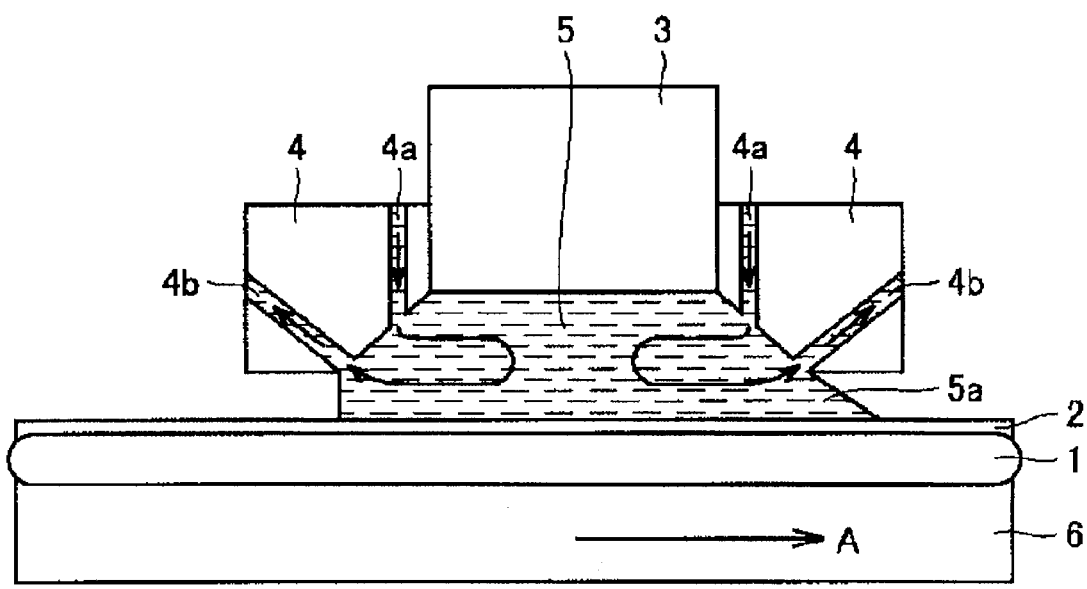
FIG. 1 is an outline view of an immersion scanning exposure.

Hereinafter, the present invention will be described in more detail. Meanwhile, drawings are used in the description of Embodiments below, and, in the drawings of the present application, those denoted by the same reference symbol are the same part or corresponding parts.

Embodiment 1

In Embodiment 1, the formation of a resist pattern in the process flow shown in FIG. 4 will be described. FIG. 5 shows a schematic drawing of the formation of the resist pattern according to the process flow shown in FIG. 4.

(Formation of a Film to be Processed: ST11)

Figure 4:
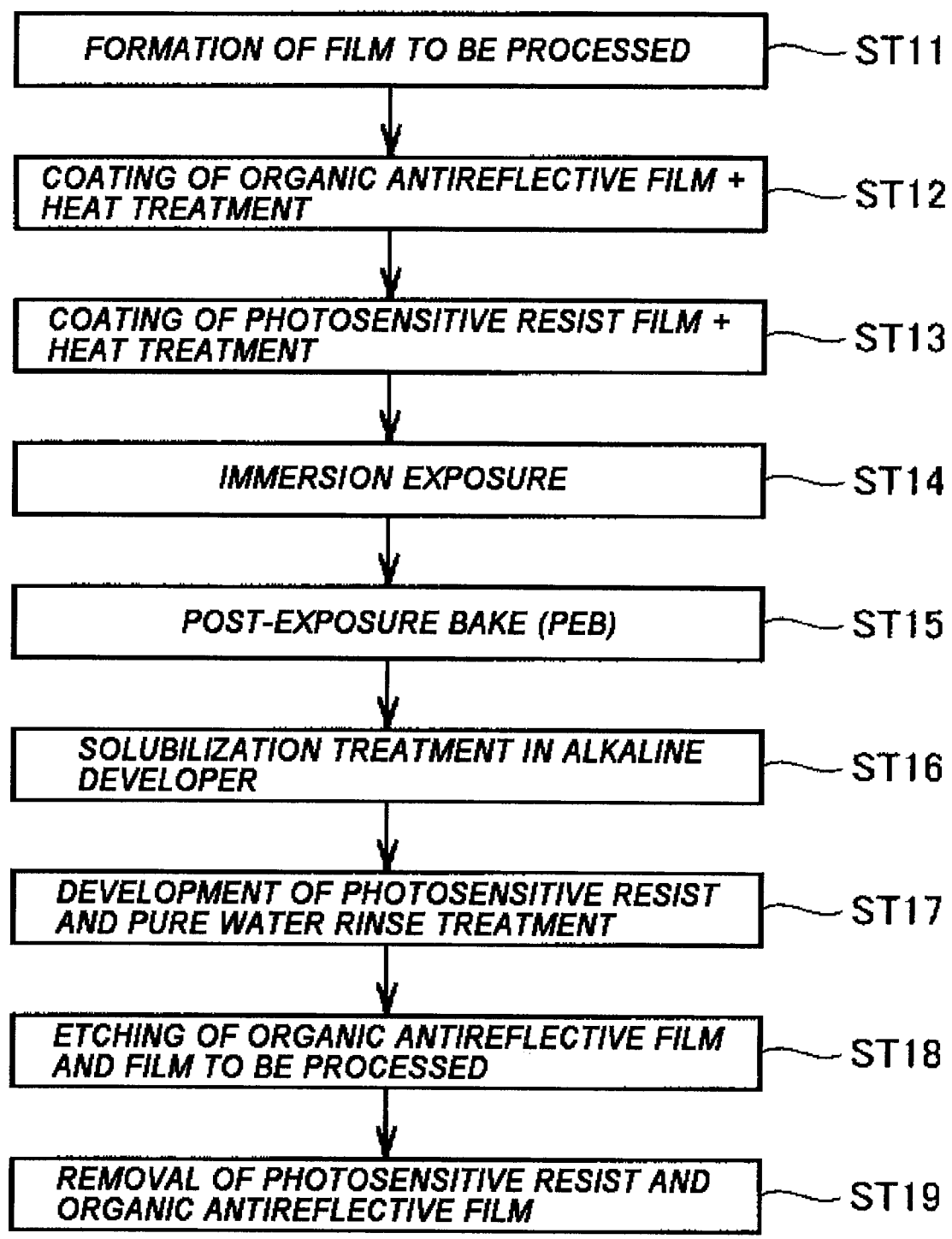
FIG. 4 is a process flow of Embodiment 1 and Example 1.
Figure 5:
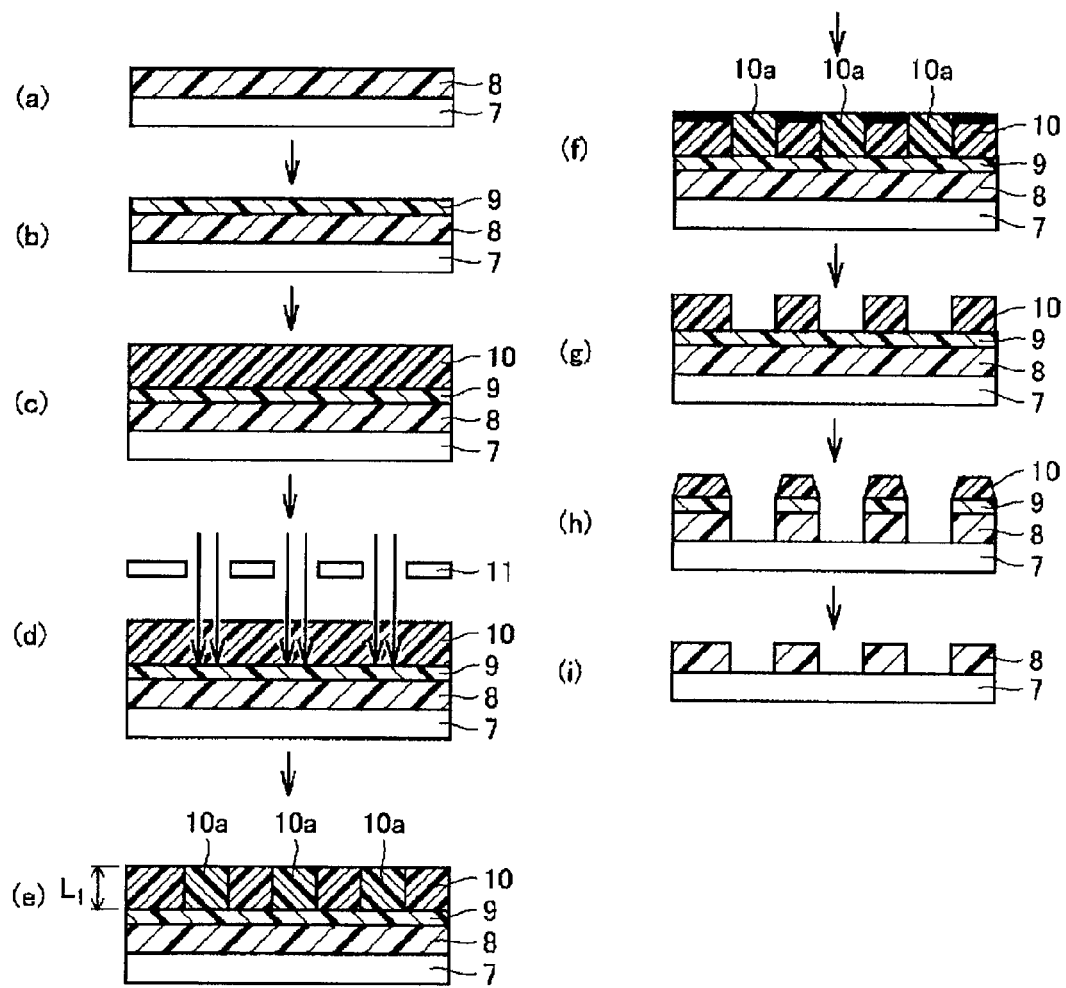
FIG. 5 is a schematic drawing illustrating the process of Embodiment 1 and Example 1.

ST11 in FIG. 4 corresponds to FIG. 5(a), and includes a process of forming a film to be processed 8 on a substrate 7, that is, the process of forming $SiO_2$, $Si_3N_4$, or TEOS $((C_2H_5)_4SiO_4)$ usually formed in electronic devices as the film to be processed. These films to be processed are formed by a conventionally known method.

(Coating of an Organic Antireflective Film and a Heat Treatment: ST12)

ST12 in FIG. 4 corresponds to FIG. 5(b), and includes a process of coating a material to be an organic antireflective film on the film to be processed 8, and a process of curing the material by a heat treatment after the coating to form an organic antireflective film 9. As the material to be the organic antireflective film, publicly known one, which is formed by heat curing after the coating, can be employed.

(Coating of a Photosensitive Resist Film and a Heat Treatment: ST13)

ST13 in FIG. 4 corresponds to FIG. 5(c), and is a process of coating a photosensitive resist to be a photosensitive resist film on the organic antireflective film 9, and a process of curing the material by a heat treatment after the coating to form a photosensitive resist film 10. As the photosensitive resist, either of the so-called topcoat-less resist and the topcoat/resist process may be employed, but the use of the topcoat-less resist gives a remarkable effect of the present invention.

As the topcoat-less resist, a publicly known material containing a hydrophobic additive component and a chemical amplified resist may be employed. The photosensitive resist film 10 formed by curing the topcoat-less resist is a film of a single layer, and it is known that the hydrophobic additive segregates on the surface side thereof, and that the concentration of the hydrophobic additive component exponentially decreases as the depth from the surface of the photosensitive resist film 10 increases in the substrate 7 direction (Functional Material, Vol. 23, No. 5, May 2003, CMC Publishing CO., LTD.). In the segregation to the surface, the hydrophobic additive component segregates approximately from the uppermost surface down to the depth of 5 nm to 20 nm, although it depends on the content of the agent relative to the chemical amplified resist.

No particular limitation is imposed on the chemical amplified resist, and it may be selected and used from conventionally known ones in accordance with the purpose. For example, acrylic acid-based or methacrylic acid-based resists are exemplified. The chemical amplified resist generates an acid in the resist film by a photoreaction and the base resin of the chemical amplified resist reacts by heating after the exposure using the acid as a catalyst to form a pattern. Even when the amount of the acid generated by the exposure is small, a chain reaction progresses by thermal diffusion, and therefore very high sensitivity can be obtained.

As the hydrophobic additive, a conventionally known polymer having a small critical surface tension used in such topcoat-less resist may be employed. Specific examples thereof include fluorine-containing polymers such as a fluorine-containing resin component having a constitutional unit represented by a formula: $-(CH_2-C(COOY_0R_f)R)-$, and the like. In the formula, R is a hydrogen atom, a lower alkyl group, a halogen atom or a halogenated lower alkyl group, $Y_0$ is an alkylene group, and $R_f$ is a fluorinated alkyl group. The content of such hydrophobic additive relative to the chemical amplified resist may appropriately be adjusted corresponding to the depth to be segregated.

(Immersion Exposure: ST14)

ST14 in FIG. 4 corresponds to FIG. 5(d), and is a process of exposing the photosensitive resist film 10 via a mask 11 having an intended resist pattern. The exposure is performed by the immersion exposure.

FIG. 1 shows the outline of the immersion exposure (immersion lithography). The immersion lithography is a lithographic method of, as shown in FIG. 1, forming immersion water 5 as a film-shaped meniscus 5a in a minute gap between a photosensitive resist film 2 formed at the uppermost face of a wafer 1 placed on a stage 6 and a lens 3, and scanning the wafer 1 (for example, an arrow A in FIG. 1) while irradiating light through the meniscus 5a and a mask (not shown) to perform scanning exposure. Here, the structure is such that the immersion water 5 to form the meniscus 5a flows in from an inflow port 4a provided around the lens 3 and is absorbed from a suction port 4b into an external device, and thus an immersion liquid 5 filling the gap between the lens 3 and the photosensitive resist film 2 is replaced.

(Post-Exposure Bake: ST15)

ST15 in FIG. 4 corresponds to FIG. 5(e), wherein, by performing a heat treatment to the exposed photosensitive resist film 10, a post-exposure heat treatment, (post-exposure bake treatment, also referred to as PEB treatment), the chain reaction progresses from the exposed portion of the photosensitive resist film 10 in a depth direction by thermal diffusion to form an intended pattern 10a portion. On this occasion, the photosensitive resist film has a whole thickness $L_1$, and the hydrophobic additive segregates at the surface layer thereof.

The post-exposure bake means a process of heating at least the photosensitive resist film 10 formed at the wafer in a range from 80° C. to 130° C. for 60 to 120 seconds.

(Solubilization Treatment in an Alkaline Developer: ST16)

ST16 in FIG. 4 corresponds to FIG. 5(f) and is a process of treating a layer so as to be solubilized in an alkaline developer being a developer, the layer being formed at the surface of the photosensitive resist film 10 having been subjected to the post-exposure bake and being constituted of the hydrophobic additive having no solubility or poor solubility in a developer (occasionally referred to as a solubilization treatment in an alkaline developer, or a solubilization treatment in a developer). The present invention is characterized by performing the process of the solubilization in an alkaline developer for the resist film having been subjected to the immersion exposure by exposing it to ozone gas without the irradiation of ultraviolet rays (occasionally referred to as an ozone treatment).

For generating ozone for use in the ozone treatment, a publicly known ozone gas generator can be employed, but in such ozone gas generator, it is known that light such as ultraviolet rays is used for generating ozone. The studies of the present inventors revealed that direct irradiation of the light such as ultraviolet rays to the surface of the photosensitive resist film 10 after the exposure or the PEB treatment generates such problems as the dissolution, destruction or deformation of the resist pattern that should be left after the development.

In order to prevent the adverse effect to the resist pattern by light such as ultraviolet rays, the present invention is provided with a mechanism in which light including ultraviolet rays used for generating ozone gas is not directly irradiated to the resist film. Such mechanism may be provided to a chamber for use in the solubilization treatment in a developer, or to the ozone gas generator.

FIGS. 6(a) and 6(b) show schematic views of the chamber for use in the solubilization treatment in a developer. A chamber 63 for use in the solubilization treatment in a developer is provided with a heating member 62 such as a hot plate capable of placing a wafer 61 therein and heating the wafer, and with an exhaust port 64 and a feed port 65. When the ozone gas generator is provided with the mechanism of not allowing the light such as ultraviolet rays used for generating ozone gas to irradiate directly the resist film, it is possible to perform the solubilization treatment in a developer, by arranging a pipe or the like so that the ozone gas from an ozone gas generator (not shown) can be exhausted, feeding ozone gas from the feed port 65 of the chamber for use in the solubilization treatment in a developer, and exposing the wafer surface to the ozone gas, as shown in FIG. 6(a). When the chamber for use in the solubilization treatment in a developer is provided with a mechanism of not allowing the light such as ultraviolet rays used for generating ozone gas to irradiate directly the resist film, it is useful in an embodiment provided with an ozone gas generator 67 that generates ozone gas in the chamber, as shown in FIG. 6(b). There are two methods of performing the solubilization treatment in a developer using the chamber provided with such ozone gas generator, that is, (1) ozone to be used for the treatment is generated in all the intended amount with an ozone generation source disposed in the chamber, and (2) ozone to be used for the treatment is generated with the ozone generation source disposed in the chamber, and, in addition, is generated outside the chamber and introduced inside the chamber. In the instance of the former (1), oxygen introduced into the chamber via the feed port 65 is ozonized with the ozone gas generator 67 made of an electrode or a light irradiation device using, for example, a barrier discharge or the like, and the wafer surface is exposed to the ozone gas to perform the solubilization treatment in a developer. The latter method (2) is used in cases of more precisely adjusting the ozone concentration in the chamber. That is, when the ozone concentration introduced into the chamber via the feed port varies (decreases) as compared with that at the introduction due to the deactivation at the introduction or in the chamber, or the like, additional ozone is generated in the chamber to compensate the variation part, and the wafer surface is exposed to the ozone gas of the introduced ozone and the ozone generated in the chamber to perform the solubilization treatment in a developer. On these occasions, in order that the light such as ultraviolet rays generated for ozonizing oxygen gas does not directly irradiate the resist surface, for example, a shielding plate 66 is disposed between the ozone gas generator 67 and the wafer 61. The shielding plate 66 may have, for example, a mode of being supported by support media provided at both ends of the ozone gas generator 67, or a mode of being held at an intended position by a support medium (not shown) independent from the ozone gas generator 67.

Meanwhile, the chamber for use in the solubilization treatment in a developer is not limited to one having the structure as shown in FIGS. 6(a) and 6(b), but those that have any position and number of the feed port and the exhaust port, any position and structure for disposing the ozone-generating apparatus, and any shape of the chamber may be sufficient only when they enable the solubilization treatment in a developer to be performed. The gas exhaust port 64 and the gas feed port 65 are used for exhausting and feeding, respectively, dry air, an inert gas, ozone gas, or oxygen gas. The dry air and inert gas are introduced into the chamber 63 alongside the introduction of ozone gas and oxygen gas, and used for adjusting the concentration of the ozone gas, as described later.

In the ozone treatment method, the concentration of ozone is important. A low ozone concentration requires a long time for the solubilization treatment in a developer, which is not preferable from the standpoint of the device manufacturing efficiency. On the other hand, a high ozone concentration makes a short time treatment possible, preferably. An appropriate value of the ozone concentration is preferably 1.5 to 20.5%, more preferably 8.4 to 20.5%. In the invention, such ozone concentration is represented in the concentration per unit volume in the treatment region, and, within the range, concentration gradient in the treatment region is allowable.

In the ozone treatment, the ozone treatment time may be shortened accordingly when the ozone concentration is high, and, from the standpoint of productivity, it is preferably 1 to 300 seconds, more preferably 5 to 60 seconds. The use of an ozone gas having a high ozone concentration of, for example, 20.5% or higher makes the solubilization treatment in a developer within a shorter time possible. On this occasion, provision against the risk of explosion is necessary.

Meanwhile, the treatment time and the treatment temperature applied in the solubilization treatment in a developer are not limited to those in the above range, but optimal conditions may be selected depending on the relation between the ozone concentration and the developer solubilization, according to the kind of the topcoat-less resist to be used. No limitation is imposed on the depth of the solubilization treatment in a developer from the surface of the photosensitive resist film only when it is within a range that sufficiently suppresses defects caused by the immersion exposure and does not work against subsequent processes such as etching. The hydrophobic additive may remain on the surface layer of the photosensitive resist film after the alkali development after the solubilization treatment in a developer, and further after the rinse treatment with deionized water. Further, the solubilization treatment in a developer may be performed down to the depth at which the hydrophobic additive is completely removed. However, when too long a time is required for the solubilization treatment in a developer, an influence is given on the pattern shape or dry etching resistance of the resist formed after the alkali development. Further, the extension of the process time occasionally results in the lowering in the throughput of the wafer. Accordingly, based on the aforementioned reason, the time of the solubilization treatment in a developer is preferably 1 to 300 seconds, more preferably 5 to 60 seconds.

Into the ozone gas to be used, an inert gas such as Ar or nitrogen, or dry air may be introduced, and an additive such as ammonia, acetic acid or water vapor may be introduced in a range that does not have harmful effect upon the resist pattern and pattern defect, in order to enhance the reactivity of the hydrophobic additive for the solubilization treatment in a developer.

Conditions of solubilization treatment in a developer using ozone gas are different depending on the material composition constituting the photosensitive resist film. In the case of the process flow where the post-exposure bake (PEB) and the solubilization treatment in a developer are performed separately, as shown in Embodiment 1, in order to suppress the influence on the resist pattern shape, the solubilization treatment in a developer is desirably performed at 120° C. or less preferably. The heating at the time of the solubilization treatment in a developer using ozone gas is an effective means for progressing the degree of the developer solbulization, and, therefore, controlling both the heating at the time of the ozone treatment and the PEB is effective for obtaining an intended resist pattern. On this occasion, too, since a high ozone concentration can perform the solubilization treatment in a developer in a short time, the influence on the resist pattern can be suppressed.

(Development of Photosensitive Resist and a Deionized Water Rinse Treatment: ST17)

ST17 in FIG. 4 corresponds to FIG. 5(g), and includes a process of developing the photosensitive resist film 10 having been subjected to the solubilization treatment in a developer, and, subsequently, a process of subjecting the developed photosensitive resist film 10 to a rinse treatment using deionized water.

The process of developing the photosensitive resist film 10 is performed by immersing the whole wafer or a film portion formed at the wafer surface in a publicly known alkaline developer. In the development process, a pattern portion 10a of the photosensitive resist film 10 and the hydrophobic additive layer portion having been subjected to the solubilization treatment in a developer are removed. Here, the hydrophobic additive layer of a general topcoat-less resist has a thickness of about 5 to 20 nm, but the hydrophobic additive layer may be removed in the treatment by an amount that enables the defect caused by the immersion exposure to be suppressed greatly. The removal amount varies depending on the property of a resist to be used, and too small a removal amount cannot give a sufficient defect-reducing effect. On the other hand, too large a removal amount does not allow the photosensitive resist film to function as the mask at the time of processing the film to be processed using etching, lowers exposure latitude, or has harmful effects upon the resist pattern shape. Consequently, the appropriate value of the removal amount is preferably 3 to 30 nm, more preferably 5 to 20 nm. That is, after the development process, the hydrophobic additive layer may be left, or may be completely removed.

The rinse treatment process using deionized water may be performed by such publicly known method as immersing the wafer in deionized water, or pouring deionized water to the film.

(Etching of the Organic Antireflective Film, and the Film to be Processed: ST18)

ST18 in FIG. 4 corresponds to FIG. 5(h), and is a process of etching the organic antireflective film 9 and the film to be processed 8 using the photosensitive resist film 10 having been subjected to the development process and the deionized water rinse process as a mask. Such etching process may be performed by conventionally known dry etching.

(Removal of the Photosensitive Resist and the Organic Antireflective Film: ST19)

ST19 in FIG. 4 corresponds to FIG. 5(i), and is a process of removing the photosensitive resist film 10 and the organic antireflective film 9 after the etching process. These photosensitive resist film and the organic antireflective film are removed using a solution containing a solvent capable of dissolving the resin constituting these films. In the present invention, the resist pattern can be formed according to the aforementioned processes.

(Other Processes)

In the method of forming a resist pattern of the invention, the deionized water rinse process may suitably be included between respective processes.

(Method of Manufacturing an Electronic Device)

Electronic devices can be manufactured using the substrate to which a resist pattern is formed according to the aforementioned processes. An example of manufacturing an electronic device is shown. As an interlayer film in a publicly known contact process, a TEOS silicon oxide film is deposited by CVD, which is used as a film to be processed to form a resist mask of a contact hole pattern by the immersion lithography including the process of solubilization treatment in a developer. After that, a hole is opened at the TEOS silicon oxide film being the film to be processed by dry etching, and then the resist mask is removed. In the hole, a thin film barrier metal is formed, and, after forming a tungsten film thereon by CVD, the tungsten is embedded inside the contact hole as a plug by etch back using CMP.

Next, for forming a single damascene structure as a process of forming a first metal wiring, a low-permittivity interlayer insulating film (a Low-K film) is formed, and the low-permittivity interlayer insulating film (the Low-K film) is used as the film to be processed and is subjected to lithography, etching and resist removal by a publicly known method, to form a trench wiring pattern. In the trench, the barrier metal is formed, Cu is embedded therein by a plating treatment, and it is etched-back by CMP to form the first metal wiring.

Further, in order to form a structure of a dual damascene system as a process of forming a second metal wiring, a liner film, and the low-permittivity interlayer insulating film (the Low-K film) are formed, and, by lithography and etching of a hole and a trench, and resist removal, the second metal wiring is formed. These processes are repeated several times for a laminated layer to complete a process of forming a wafer of an electronic device. Further, after that, via such publicly known post-processes as passivation, dicing, wire bonding and mold, the electronic device can be manufactured.

Since the method of forming a resist pattern of the present invention can perform the immersion lithography of high throughput with low defects, electronic devices manufactured using the substrate having the resist pattern formed by the method can provide electronic devices excellent in the duration of life and reliability. Examples of these electronic devices include semiconductor devices, liquid crystal displays, magnetic heads, micro lenses and the like.

Embodiment 2

Figure 7:
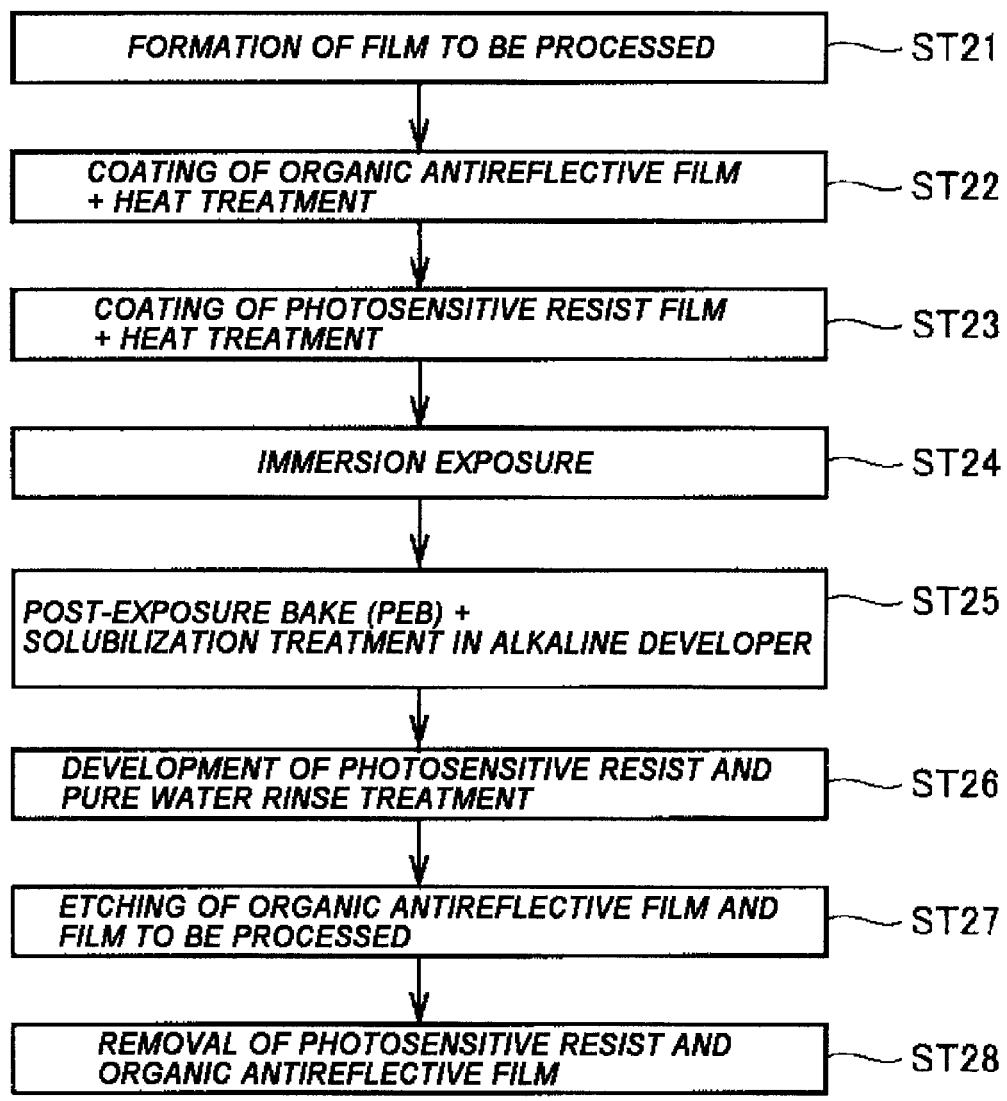
FIG. 7 is a process flow of Embodiment 2 and Example 2.
Figure 8:
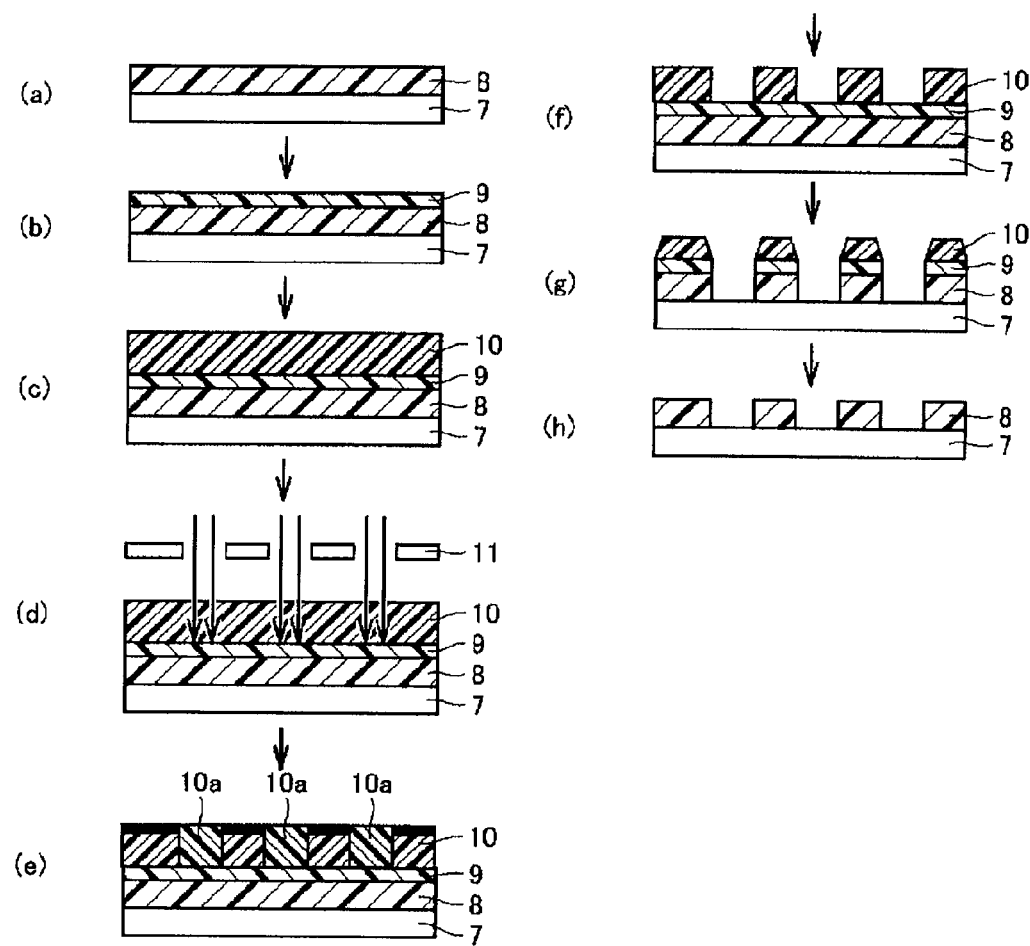
FIG. 8 is a schematic drawing illustrating the process of Embodiment 2 and Example 2.

In Embodiment 1, the process of the solubilization in an alkaline developer is performed after the PEB treatment, but simultaneous performing of the PEB treatment and the process of the solubilization in an alkaline developer also exerts the effect of the present invention. FIG. 7 shows the process flow in such Embodiment 2. FIG. 8 shows a schematic drawing of the formation of the resist pattern according to the process flow shown in FIG. 7.

Respective processes of ST21 to ST24 in FIG. 7 correspond to respective processes of ST11 to ST14 in FIG. 5 in this order, and respective processes of ST26 to ST28 in FIG. 7 correspond to respective processes of ST17 to ST19 in FIG. 5 in this order. Therefore, the description thereof is omitted.

In Embodiment 2, as described above, the PEB treatment and the solubilization treatment in an alkaline developer are performed simultaneously (ST25 in FIG. 7). On the substrate 7, the film to be processed 8 is formed (FIG. 8(a)), and, further, the organic antireflective film 9 is formed thereon (FIG. 8(b)). After that, a material to be the photosensitive resist film 10 is coated thereon and then heat-treated to form the photosensitive resist film 10 (FIG. 8(c)). To the photosensitive resist film 10, the immersion exposure is performed via a mask 11 (FIG. 8(d)).

When performing a simultaneous treatment with the post-exposure bake of the photosensitive resist film (FIG. 8(e)), it is necessary to perform the solubilization treatment in a developer in accordance with the heating temperature and time most suitable for the photosensitive resist film. Generally, the heat treatment after the exposure can be performed by performing a heat treatment in a temperature range of 90° C. to 130° C. for about 60 seconds. In order to simultaneously complete the solubilization treatment in a developer in this degree of treatment time, the ozone concentration is required to be high, and is preferably 3% to 20.5%, more preferably 8% to 20.5%. Here, when the chamber in which the wafer is placed is opened just after the ozone treatment (solubilization treatment in a developer), there is such risk that the ozone may leak into the wafer-conveying path, inside of the apparatus, or clean room. In order to prevent this, substitution of the inside of the chamber with dry air, or an inert gas such as Ar or nitrogen is effective. Further, from the standpoint of suppressing the influence on the shape of the resist pattern or the influence on the wafer throughput, in the case of a process flow of simultaneously performing the post-exposure bake and the solubilization treatment in a developer, the solubilization treatment in a developer is desirably performed preferably within 180 seconds, more preferably within 60 seconds, including the aforementioned time necessary for the substitution with another gas.

To the photosensitive resist film 10 having been simultaneously subjected to the post-exposure bake and the solubilization treatment in a developer, the development process and the deionized water rinse treatment process are performed (FIG. 8(f)), and after etching the organic antireflective film 9 and the film to be processed 8 (FIG. 8(g)), the photosensitive resist film 10 and the organic antireflective film 9 are removed to give the substrate 7 at which the resist pattern is formed (FIG. 8(h)). The obtained substrate 7 is provided to manufacture of electronic devices, as is the case for Embodiment 1.

Embodiment 3

Figure 9:
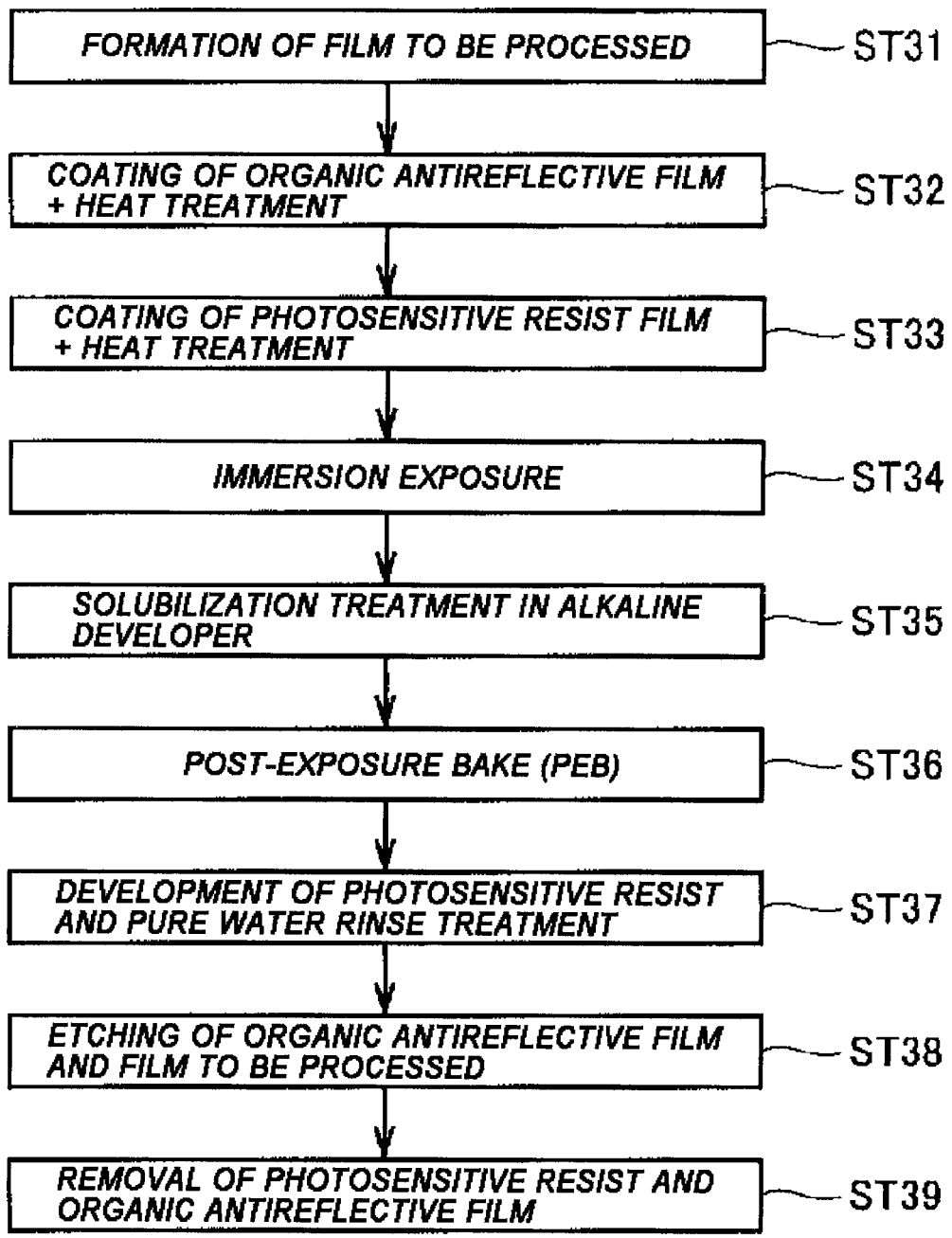
FIG. 9 is a process flow of Embodiment 3 and Example 3.
Figure 10:
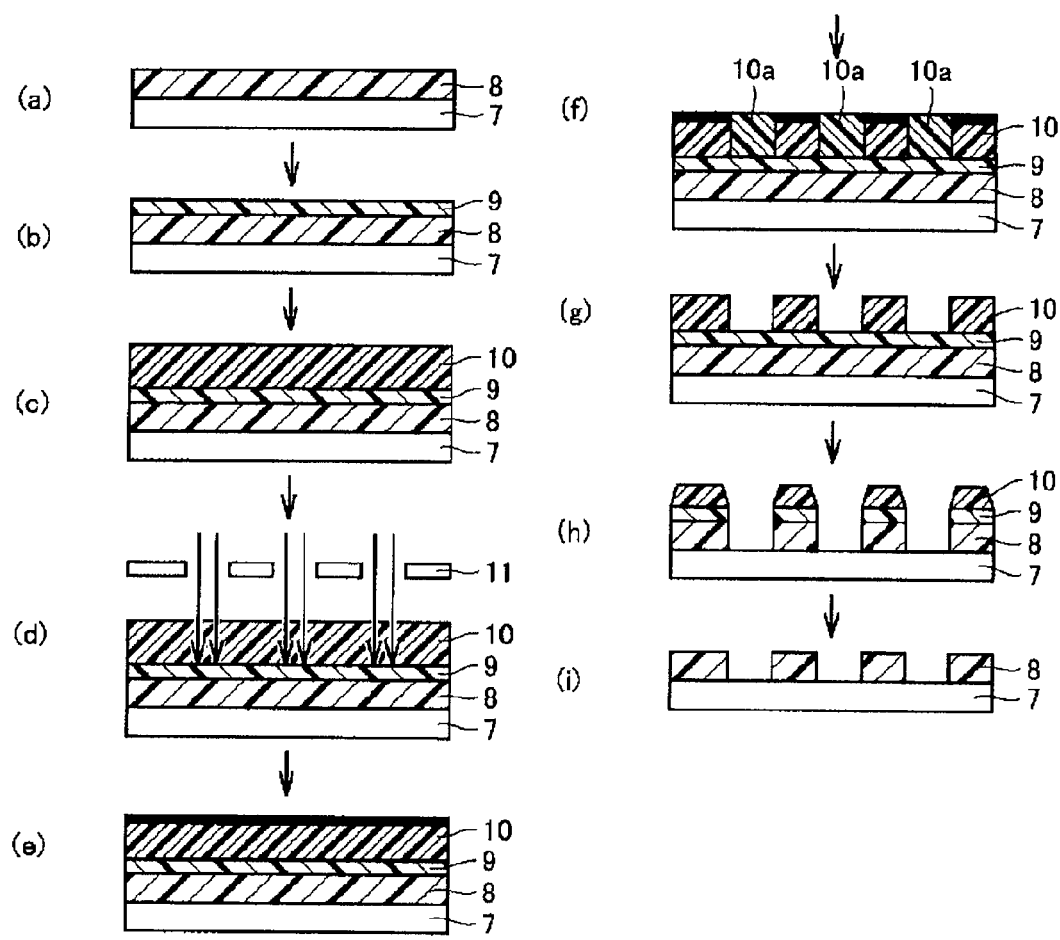
FIG. 10 is a schematic drawing illustrating the process of Embodiment 3 and Example 3.

In the invention, an embodiment, in which the solubilization treatment in a developer is performed just before the post-exposure bake treatment, is allowable. FIG. 9 shows the process flow in Embodiment 3. FIG. 10 shows a schematic drawing of forming a resist pattern according to the process flow shown in FIG. 9.

Respective processes of ST31 to ST34 in FIG. 9 correspond to respective processes of ST11 to ST14 in FIG. 5 in this order, and respective processes of ST36 to ST39 in FIG. 9 correspond to respective processes of ST15 and ST17 to ST19 in FIG. 5 in this order. Therefore, the description thereof is omitted.

In Embodiment 3, on the substrate 7, a film to be processed 8 is formed (FIG. 10(a)), and further an organic antireflective film 9 is formed thereon (FIG. 10(b)). After that, a material to be the photosensitive resist film is coated and then heat-treated to form the photosensitive resist film 10 (FIG. 10(c)). The immersion exposure is performed to the photosensitive resist film 10 via a mask 11 (FIG. 10(d)).

Next, in Embodiment 3, the solubilization treatment in a developer is performed (FIG. 10(e)). On this occasion, the treatment time and treatment temperature for use in the solubilization treatment in a developer can be set to the same value as those in Embodiment 1, that is, it is sufficient to select the most suitable condition for the topcoat-less resist to be used. However, when the time necessary for the solubilization treatment in a developer becomes too long, occasionally the time interval from the exposure to the post-exposure bake becomes too great, and imposes a harmful influence to the shape of the resist pattern to be formed after the alkali development. Further, the extension of the process time causes the lowering in the throughput of the wafer. Accordingly, when performing the solubilization treatment in a developer just before the post-exposure bake treatment as is the case of Embodiment 3, the time for the solubilization treatment in a developer is preferably within 300 seconds, more preferably within 60 seconds.

For the photosensitive resist film 10 having been subjected to the solubilization treatment in a developer as described above, the post-exposure bake is performed (FIG. 10(f)), and subsequently the development process and the deionized water rinse treatment process are performed (FIG. 10(g)), and, after etching the organic antireflective film and the film to be processed 8 (FIG. 10(h)), the photosensitive resist film 10 and the organic antireflective film 9 are removed to give the substrate 7 at which a resist pattern is formed (FIG. 10(i)). The obtained substrate 7 is provided to the manufacture of electronic devices, as is the case for Embodiment 1.

EXAMPLES

Hereinafter, the present invention will be described in more detail with reference to Examples, but the invention is not limited thereto. Meanwhile, in the description (including Tables) below, "Ref." means Comparative Example in which a pattern is formed in the substantially same manner as that in corresponding Example, except for not including the ozone treatment.

Example 1

According to Embodiment 1, a resist pattern was formed based on the process flow shown in FIGS. 4 and 5. Firstly, on a substrate 7 at which a film to be processed 8 was formed, an organic antireflective film 9 (thickness: 45 to 100 nm) was coated, on which a bake treatment (a heat treatment) was performed at 150 to 230° C. for 60 to 180 seconds. After that, commercially available topcoat-less resists (thickness: 150 nm), which contained hydrophobic additives having different properties as shown in Table 1, were spin-coated under respective conditions shown in Table 1, which were subjected to a bake treatment to form respective photosensitive resist films 10. The substrate was subjected to the immersion exposure treatment with an immersion exposure machine, which was subjected to a post-exposure bake under respective conditions shown in Table 1, and then it was subjected to the ozone treatment under respective conditions shown in Table 2. After that, a development treatment was performed with a 2.38% aqueous solution of tetramethylammonium hydroxide, and then the deionized water rinse treatment was performed to complete the pattern formation.

TABLE 1

| Commercially available TC resist | Hydrophobic additive type | Coating thickness (nm) | Pre-exposure bake (° C./sec) | Post-exposure bake (° C./sec) |
|---|---|---|---|---|
| Resist-A | Alkali-soluble | 150 | 85/60 | 90/60 |
| Resist-B | Acid-deprotection | 150 | 115/60 | 115/60 |
| Resist-C | Alkali-insoluble | 150 | 100/60 | 115/60 |

TABLE 2

| | Ozone concentration (%) | Ozone treatment time (sec) | Hot plate temperature (° C.) |
|---|---|---|---|
| Ref. | — | — | — |
| Condition 1 | 8.4 | 30 | 24 |
| Condition 2 | 8.4 | 60 | 24 |
| Condition 3 | 8.4 | 180 | 24 |

TABLE 2-continued

| | Ozone concentration (%) | Ozone treatment time (sec) | Hot plate temperature (° C.) |
|---|---|---|---|
| Condition 4 | 8.4 | 30 | 85 |
| Condition 5 | 8.4 | 60 | 85 |
| Condition 6 | 8.4 | 180 | 85 |
| Condition 7 | 8.4 | 30 | 115 |
| Condition 8 | 8.4 | 60 | 115 |
| Condition 9 | 8.4 | 180 | 115 |

Table 3 shows the thickness of topcoat-less resist (the photosensitive resist film 10 in FIG. 5(c)) that was used in Example 1 and the thickness of the photosensitive resist film 10 in an unexposed portion after the solubilization treatment in a developer (FIG. 5(f)). From Table 3, it can be understood that the photosensitive resist film surface layer constituted of the hydrophobic additive having no or poor solubility in the developer is removed after the development as the result of performing the solubilization treatment in a developer using ozone to result in the decrease in the photosensitive resist film thickness by the amount, and that the number of defects also decreases with it.

Table 4 shows the contact angle of the topcoat-less resist (FIG. 5(c)) and the outermost surface of the photosensitive resist film of an unexposed portion after the solubilization treatment in a developer (FIG. 5(f)) used in Example 1, relative to deionized water. As shown in Table 4, it is understood that the resist surface after the alkali development and deionized water rinse treatment has a more hydrophilized hydrophobicity by the solubilization treatment in a developer.

On this occasion, it was confirmed that longer ozone treatment time gives higher hydrophilicity and higher ozone treatment temperature gives higher hydrophilicity.

Further, excluding the instance of Resist-A under Condition 1, the contact angle of the outermost surface of the photosensitive resist film having been subjected to the solubilization treatment in a developer, alkali development and deionized water rinse treatment is hydrophilized as compared with the resist surface having been subjected to the alkali development and deionized water rinse treatment without performing the solubilization treatment in a developer (FIG. 5(g)). This shows that the solubilization treatment in a developer can impart hydrophilicity to a resist so that a contact angle becomes lower as compared with the contact angle the resist originally has. This treatment can suppress the generation of various defects shown in FIG. 11 that generate on the occasion of the alkaline developer treatment and subsequent deionized water rinse treatment caused by high hydrophobicity.

Using the substrate having been treated as described above, a process of forming a wafer of an electronic device was performed as follows.

As an interlayer film in the contact process, a TEOS silicon oxide film was deposited by CVD. Further, while setting the TEOS silicon oxide film as a film to be processed, a resist mask of a contact hole pattern was formed by the immersion lithography including the process of the solubilization treatment in a developer. After that, to the TEOS silicon oxide film being the film to be processed, a hole was opened by dry etching, and, next, the resist mask was removed. In the hole, a thin film barrier metal was formed, on which a tungsten film was formed by CVD, and, after that, the tungsten was embedded in the contact hole as a plug with etch back by CMP.

Next, in order to form the single damascene structure as the process of forming the first metal wiring, the low-permittivity interlayer insulating film (the Low-K film) was formed, and, while setting the low-permittivity interlayer insulating film (the Low-K film) as a film to be processed, lithography, etching and resist removal were performed by a publicly known method to form a trench wiring pattern. In the trench, a barrier metal was formed, and Cu was embedded by a plating treatment, which was etched back by CMP to form the first metal wiring.

Further, in order to form a structure of the dual damascene system as the process of forming the second metal wiring, a liner film and the low-permittivity interlayer insulating film (the Low-K film) were formed, and, by lithography and etching of the hole and trench, and resist removal, the second metal wiring was formed. The process was repeated several times for a laminated layer to complete the process of forming a wafer of an electronic device. After that, the electronic device was completed via publicly known post-processes such as passivation, dicing, wire bonding and mold.

was formed, an organic antireflective film (thickness: 45 to 100 nm) was coated, and a bake treatment (a heat treatment) was performed at 150 to 230° C. for 60 to 180 seconds. After that, commercially available topcoat-less resists (thickness: 150 nm), which contained hydrophobic additives having different properties as shown in Table 1, were spin-coated under respective conditions shown in Table 1, which were subjected to a bake treatment to form respective photosensitive resist films. The substrates were subjected to the immersion exposure with an immersion exposure machine, which were subjected simultaneously to the solubilization treatment in a developer and the post-exposure bake under respective conditions shown in Table 5. After that, a development was performed with a 2.38% aqueous solution of tetramethylammonium hydroxide, which was then subjected to the deionized water rinse treatment to complete the pattern formation.

TABLE 3

|  | Resist-A | | | Resist-B | | | Resist-C | | |
| --- | --- | --- | --- | --- | --- | --- | --- | --- | --- |
|  | Thickness (nm) | Amount of film reduction (nm) | Defect | Thickness (nm) | Amount of film reduction (nm) | Defect | Thickness (nm) | Amount of film reduction (nm) | Defect |
| Ref. | 151 | — | X | 157 | — | X | 150 | — | X |
| Condition 1 | 150 | 1 | X | 156 | 1 | X | 149 | 1 | X |
| Condition 2 | 149 | 2 | X | 155 | 2 | Δ | 149 | 1 | X |
| Condition 3 | 139 | 12 | ◉ | 145 | 12 | ◉ | 145 | 5 | ◉ |
| Condition 4 | 148 | 3 | Δ | 154 | 3 | ○ | 148 | 2 | Δ |
| Condition 5 | 147 | 4 | ○ | 154 | 3 | ○ | 147 | 3 | ○ |
| Condition 6 | 135 | 16 | ◉ | 142 | 15 | ◉ | 144 | 6 | ◉ |
| Condition 7 | 147 | 4 | ○ | 153 | 4 | ◉ | 147 | 3 | ○ |
| Condition 8 | 147 | 4 | ○ | 153 | 4 | ◉ | 145 | 5 | ◉ |
| Condition 9 | 127 | 24 | ◉ | 138 | 19 | ◉ | 140 | 10 | ◉ |

In Table 3, symbols in the column of "Defect" represent following states, while setting the number of defects in Ref. as 100:
 ◉: the number of defects is less than 0.1%;
 ○: the number of defects is from more than 0.1% to less than 10%;
 Δ: the number of defects is from 10% to less than 20%;
 x: the number of defects is from 20% to 100%.

TABLE 4

Figure 2:
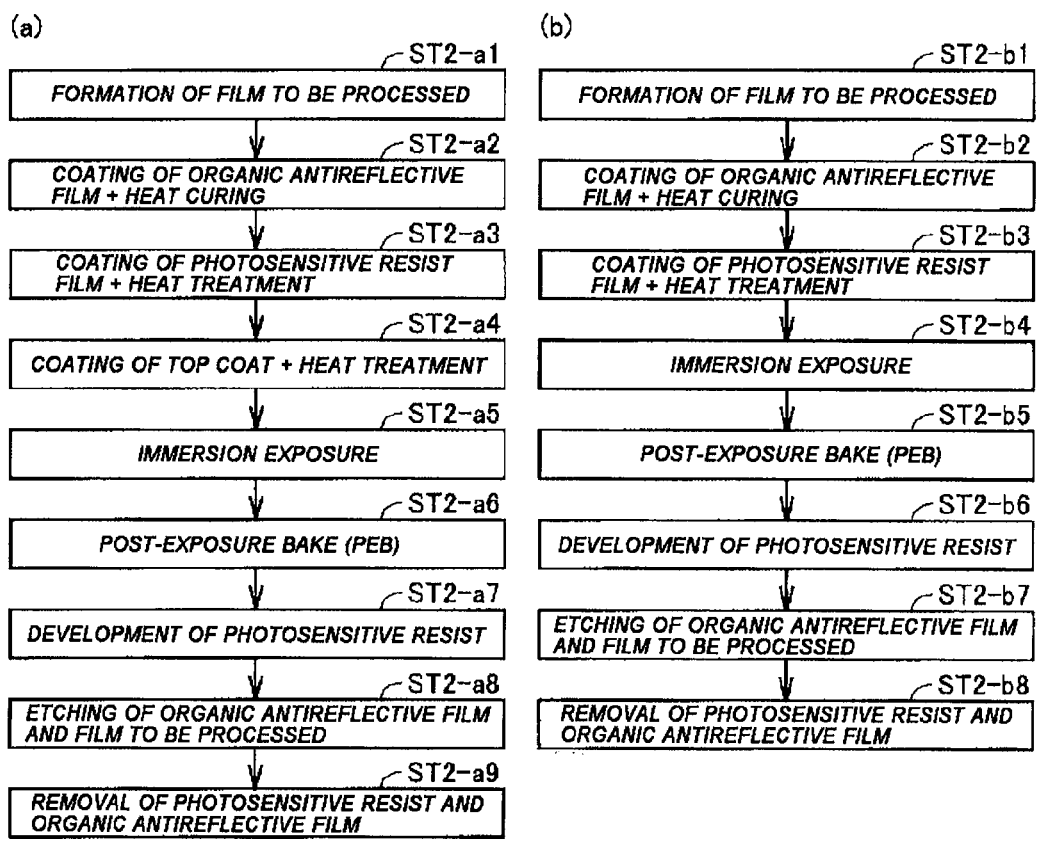
FIGS. 2(a) and 2(b) show process flows of a conventional technique, and schematically illustrate a process using a topcoat and a process with a topcoat-less resist, respectively.
Figure 6:
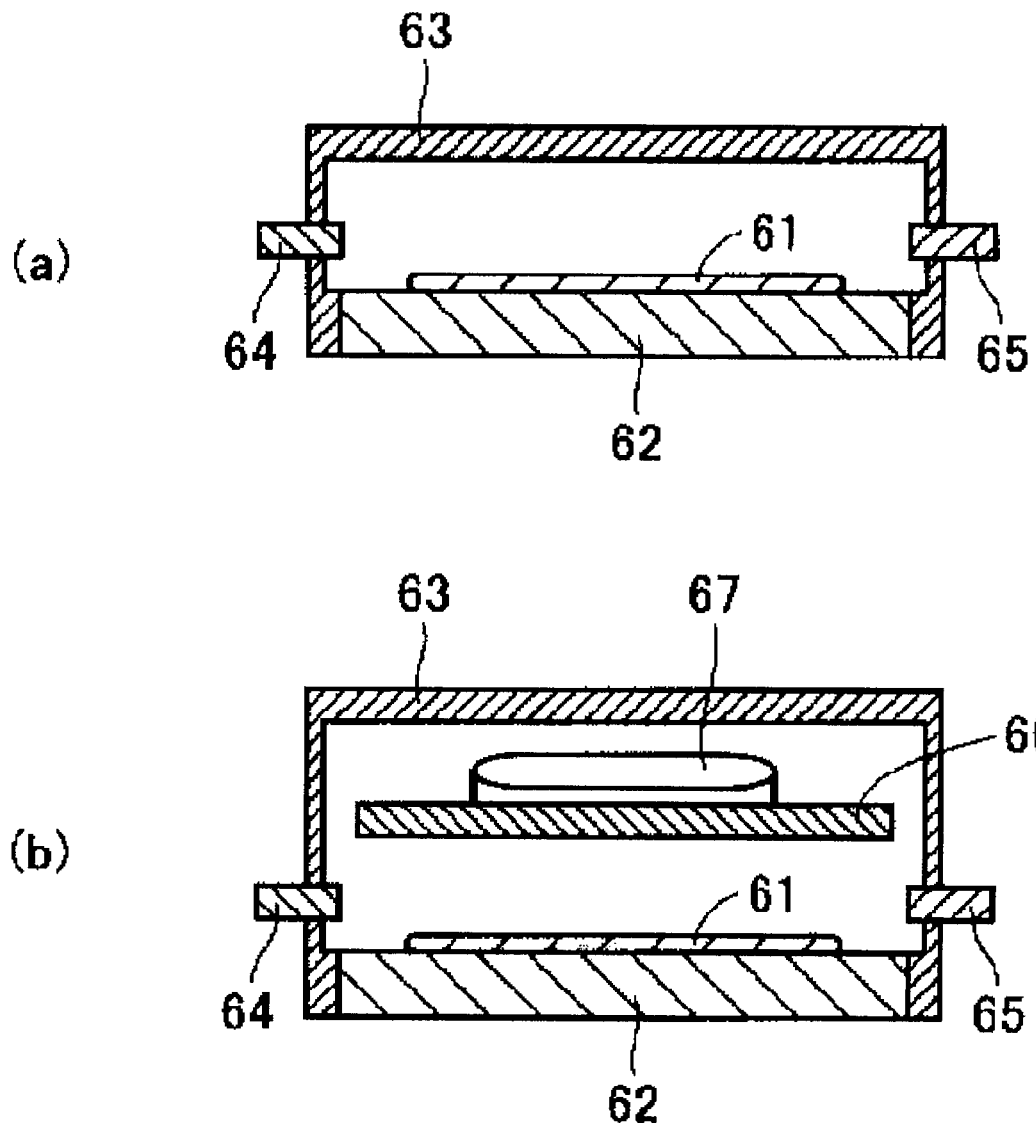
FIGS. 6(a) and 6(b) are schematic views of a chamber for the solubilization treatment in a developer.

|  | Static contact angle of resist surface (°) | | |
| --- | --- | --- | --- |
|  | Resist-A | Resist-B | Resist-C |
| FIG. 6-[3] (FIG. 2(b)-[3]) | 90 | 94 | 94 |
| (FIG. 2(b)-[6]) | 60 | 94 | 94 |
| Condition 1 | 68 | 87 | 79 |
| Condition 2 | 58 | 60 | 71 |
| Condition 3 | 57 | 59 | 63 |
| Condition 4 | 60 | 60 | 73 |
| Condition 5 | 58 | 61 | 57 |
| Condition 6 | 54 | 58 | 49 |
| Condition 7 | 52 | 53 | 50 |
| Condition 8 | 50 | 51 | 49 |
| Condition 9 | 50 | 52 | 48 |

Example 2

According to Embodiment 2, a resist pattern was formed on the basis of the process flow shown in FIGS. 7 and 8. Firstly, on the substrate 7 on which the film to be processed 8

TABLE 5

|  | Ozone concentration (%) | Ozone treatment time (sec) | Hot plate temperature (° C.) |
| --- | --- | --- | --- |
| Ref. | — | — | — |
| Condition 10 | 8.4 | 10 | 115 |
| Condition 11 | 8.4 | 60 | 115 |
| Condition 12 | 3.5 | 10 | 115 |
| Condition 13 | 3.5 | 60 | 115 |
| Condition 14 | 1.6 | 10 | 115 |

Table 6 shows the thickness of the topcoat-less resist (photosensitive resist film 10 in FIG. 8(c)) and that of an unexposed portion of the photosensitive resist film after the solubilization treatment in a developer (FIG. 8(e)) used in Example 2. In Table 6, the column of "Defect" is the result obtained on the basis of the same standard as that in the column of "Defect" in Table 3. As shown in Table 6, it is understood that, caused by the solubilization treatment in a developer using ozone, the surface layer of the photosensitive resist film is removed after the development, and that the thickness of the photosensitive resist film is reduced by the amount. By performing the treatment with an appropriate ozone concentration and time, it is possible to remove the surface layer of the photosensitive resist film including the segregated layer constituted of a hydrophobic additive having no or poor solubility in the developer, and to significantly lower defects caused by the immersion exposure. Further, it is understood that such problems as dissolution, collapse or deformation of the resist pattern can be avoided by suppressing direct irradiation of ultraviolet rays and the like that occur when generating ozone, at the resist surface.

TABLE 6

| | Resist-A | | | Resist-B | | | Resist-C | | |
| --- | --- | --- | --- | --- | --- | --- | --- | --- | --- |
| | Thickness (nm) | Amount of film reduction (nm) | Defect | Thickness (nm) | Amount of film reduction (nm) | Defect | Thickness (nm) | Amount of film reduction (nm) | Defect |
| Ref. | 151 | — | X | 157 | — | X | 150 | — | X |
| Condition 10 | 148 | 3 | ⊚ | 156 | 1 | ○ | 148 | 2 | ○ |
| Condition 11 | 147 | 4 | ⊚ | 153 | 4 | ⊚ | 145 | 5 | ⊚ |
| Condition 12 | 149 | 2 | Δ | 156 | 1 | ○ | 149 | 1 | X |
| Condition 13 | 148 | 3 | ○ | 157 | 0 | X | 148 | 2 | ○ |
| Condition 14 | 150 | 1 | X | 157 | 0 | X | 149 | 1 | X |

Table 7 shows the contact angle of the topcoat-less resist (FIG. 8(c)) and an unexposed portion of the outermost surface of the photosensitive resist film after the solubilization treatment in a developer (FIG. 8(e)) obtained in Example 2 relative to deionized water. As shown in Table 7, it is understood that the hydrophilization of the outermost surface of the photosensitive resist film progresses by the solubilization treatment in a developer. When performing the post-exposure bake of the resist at the same time, it is necessary to perform the solubilization treatment in a developer in accordance with the optimal heating temperature and time for the resist, which is generally 90 to 130° C./60 sec as described in Embodiment 2. In order to complete the solubilization treatment in a developer within around this treatment time, the ozone needs to have a high concentration, which is preferably 3 to 20.5% and more preferably 8 to 20.5%.

TABLE 7

Figure 3:
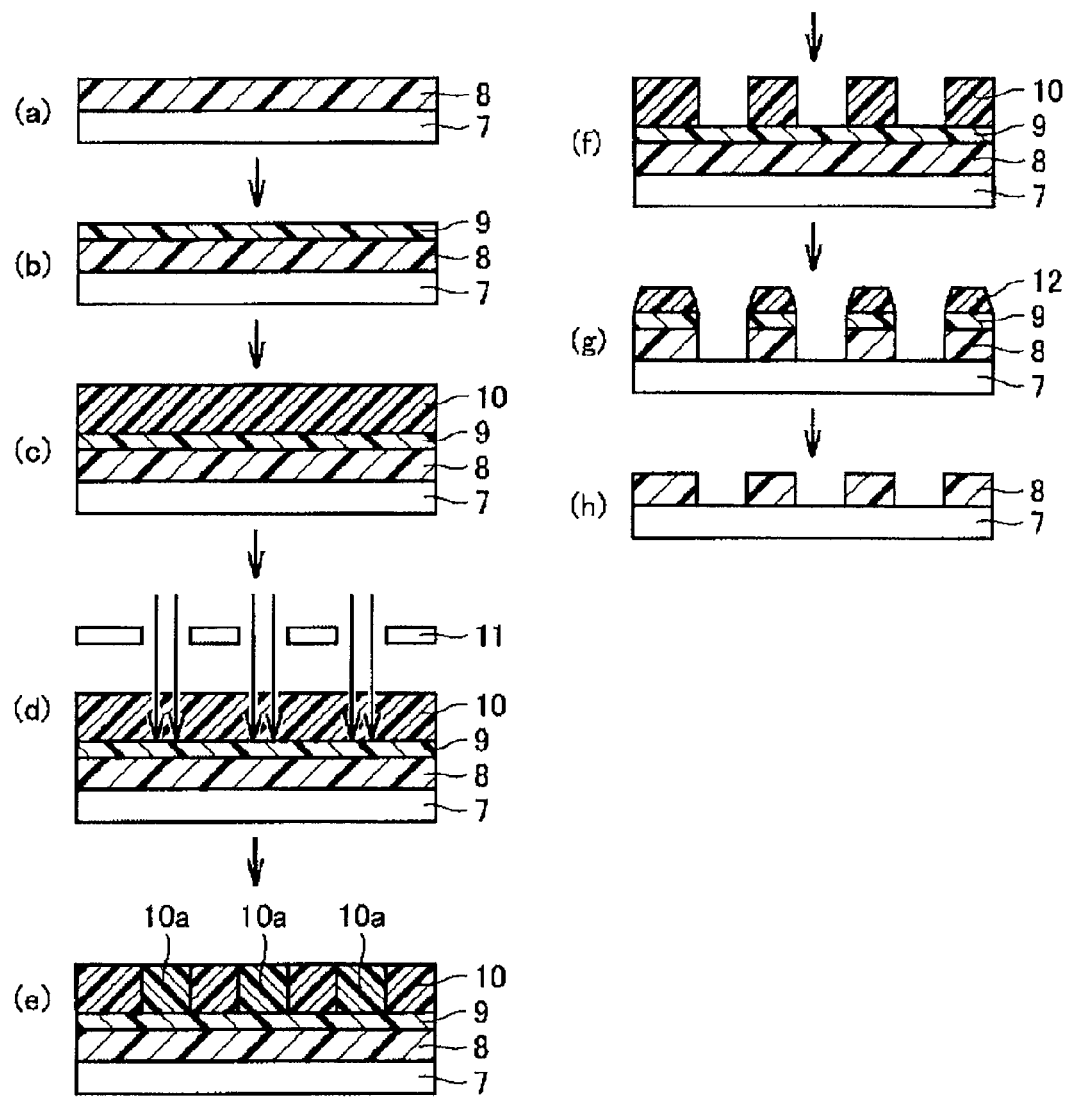
FIG. 3 is a drawing illustrating the process with the topcoat-less resist.

| | Static contact angle of resist surface (°) | | |
| --- | --- | --- | --- |
| | Resist A | Resist B | Resist C |
| Ref. [FIG. 9-3] | 90 | 94 | 94 |
| Condition 10 | 81 | 76 | 64 |
| Condition 11 | 46 | 43 | 52 |
| Condition 12 | 85 | 81 | 45 |
| Condition 13 | 38 | 62 | 57 |
| Condition 14 | 87 | 87 | 83 |

Using the substrate having been treated as described above, the wafer-forming process of an electronic device was performed in the same process as that in Example 1.

Table 8 shows the result of the patterning of 100 nm line & space, a 100 nm isolated space and a 100 nm isolated line for Resist-A listed in Table 1 formed using the solubilization treatment in a developer shown by Condition 10. In Table 8, "Micro bridge" represents that a micro bridge generated as a pattern defect, and "–" represents that no pattern defect generated. As can be seen from the result in Table 8, in the case of no solubilization treatment in a developer, many micro bridge defects appeared, but no defect appeared after the solubilization treatment in a developer. This is because the resist surface layer dissolved and was removed in the developer as the result of the solubilization treatment in a developer, and resist pattern defects were suppressed as the result of the improvement in the hydrophilicity of the resist surface layer.

TABLE 8

| | Patterning result of Resist-A | | |
| --- | --- | --- | --- |
| | 100 nm line & space | 100 nm isolated space | 100 nm isolated line |
| Ref. | Micro bridge | Micro bridge | — |
| Condition 10 | — | — | — |

Example 3

According to Embodiment 3, a resist pattern was formed on the basis of the process flow shown in FIGS. 9 and 10. Firstly, on the substrate 7 at which the film to be processed 8 was formed, the organic antireflective film 9 (thickness: 45 to 100 nm) was coated, to which a bake treatment (a heat treatment) was provided at 150 to 230° C. for 60 to 180 seconds. After that, commercially available topcoat-less resists (thickness: 150 nm), which contained hydrophobic additives having different properties as shown in Table 1, were spin-coated under respective conditions shown in Table 1, which were subjected to a bake treatment to form respective resist films. The substrates were subjected to the exposure treatment with an immersion exposure machine, which were subjected to the solubilization treatment in a developer using ozone. After that, a post-exposure heat treatment was performed under the conditions shown in FIG. 1. After that, a development treatment was performed with a 2.38% aqueous solution of tetramethylammonium hydroxide and then subjected to the deionized water rinse treatment to complete the pattern formation.

Using the substrate having been treated as described above, the wafer-forming process of an electronic device was performed in the same process as that in Example 1.

Figure 11:
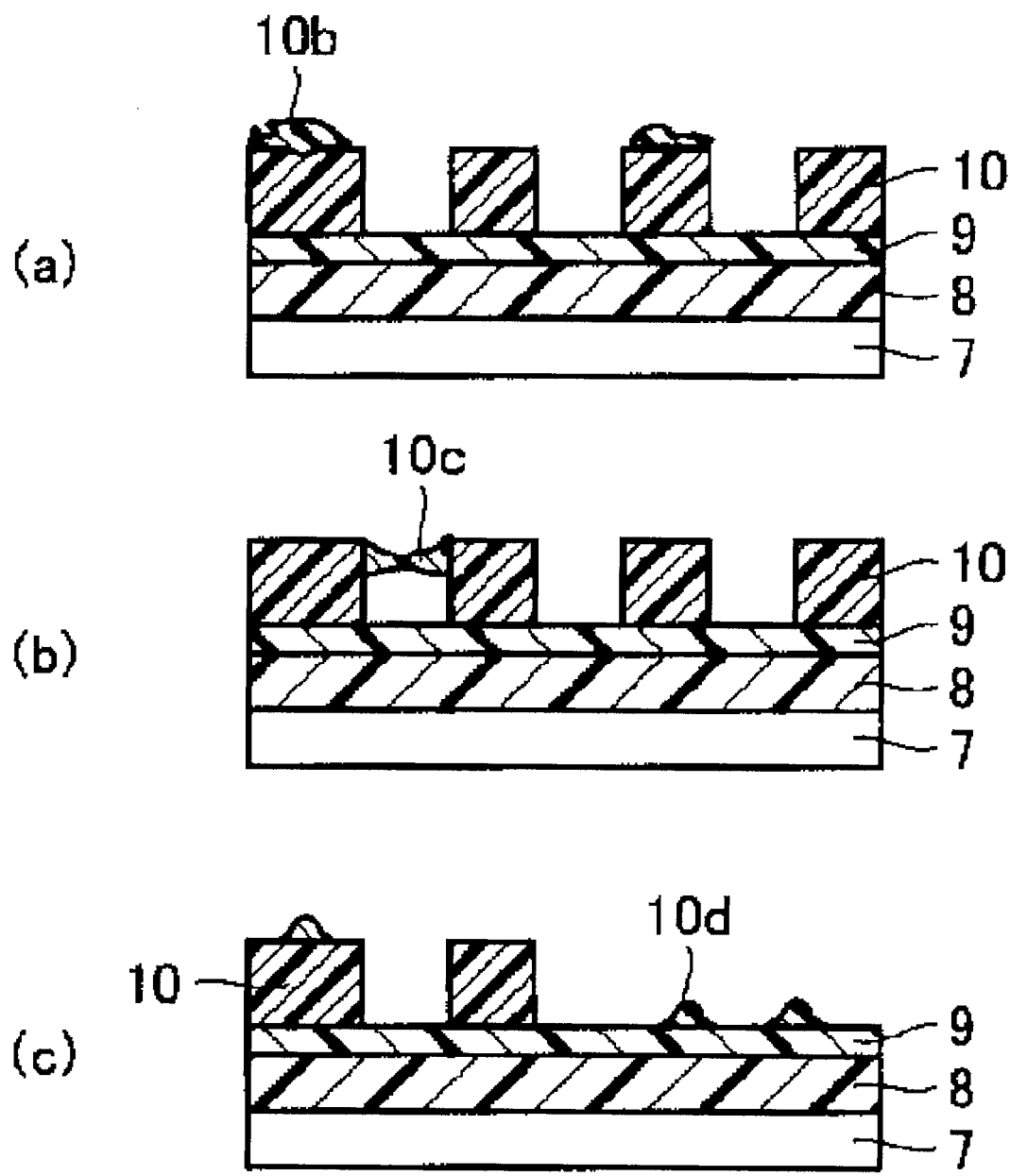
FIGS. 11(a) to 11(c) are image views of defects that occur in a method of forming a resist pattern of a conventional technique.

As the result of above treatments, the generation of various defects as shown in FIG. 11, which occurs on the occasion of the alkaline developer and subsequent deionized water treatments caused by a high hydrophobicity, was suppressed.

Till now, Embodiments and Examples of the present invention are explained, and suitably combining the constitution of respective Embodiments and respective Examples is planned from the beginning.

The Embodiments and Examples disclosed in the present specification are exemplifications in all points, and they should not be considered as limitative. The scope of the present invention is shown not by the above-described explanation but by claims, which intends to include all the change within the meaning and range of equivalence to the claim.

The method of forming a resist pattern of the present invention can be applied not only to the formation of wafers using the topcoat-less resist, but also to the formation of wafers using the top-coat/resist process.

What is claimed is:

1. A method of forming a resist pattern comprising the steps, in order recited, of:
providing immersion exposure to a resist film;
solubilizing the resist film subjected to the immersion exposure in an alkaline developer;
developing the resist film solubilized in the alkaline developer by alkali immersion; and
performing a deionized water rinse treatment on the developed resist film,
wherein the step of solubilization in the alkaline developer is performed by exposing the resist film subjected to the immersion exposure to ozone gas without irradiating ultraviolet rays.

2. The method of forming a resist pattern according to claim 1, wherein the step of solubilization in the alkaline developer is performed simultaneously with a post-exposure bake treatment, and thereafter performs the step of development by the alkali immersion and the step of the deionized water rinse treatment.

3. The method of forming a resist pattern according to claim 1, wherein the step of solubilization in the alkaline developer is performed after a post-exposure bake treatment, and thereafter performs the step of development by the alkali immersion and the step of the deionized water rinse treatment.

4. The method of forming a resist pattern according to claim 1, wherein the step of solubilization in the alkaline developer is performed just before a post-exposure bake treatment, and thereafter performs the step of development by the alkali immersion and the step of the deionized water rinse treatment.

5. The method of forming a resist pattern according to any of claims 1 to 4, wherein the step of solubilization in the alkaline developer is performed using an ozone gas generator, and an apparatus for solubilization treatment in alkaline developer provided with a heating member capable of placing a wafer therein and heating the wafer, a gas exhaust port and a gas feed port, and the ozone gas generator or the apparatus for solubilization treatment in alkaline developer is provided with a mechanism for preventing the resist film from being directly irradiated with light including ultraviolet rays used for generating the ozone gas.

* * * * *